United States Patent [19]
Horng

[11] Patent Number: 5,979,025
[45] Date of Patent: Nov. 9, 1999

[54] ENGAGEMENT DEVICES WITH DISENGAGING MEANS FOR HEAT DISSIPATING DEVICES

[75] Inventor: Alex Horng, Kaohsiung, Taiwan

[73] Assignee: Motor-One Electronics, Inc., Taiwan

[21] Appl. No.: 09/166,841

[22] Filed: Oct. 6, 1998

Related U.S. Application Data

[63] Continuation-in-part of application No. 08/946,059, Oct. 7, 1997, abandoned.

[51] Int. Cl.⁶ ................................. H05K 7/20; F28F 7/00
[52] U.S. Cl. ......................... 24/459; 361/704; 165/80.3; 24/458
[58] Field of Search ............................. 24/458, 459, 625, 24/457, 473, 464, 466, 517, 518; 165/80.3; 361/704; 248/510

[56] References Cited

U.S. PATENT DOCUMENTS

| | | | |
|---|---|---|---|
| 4,712,159 | 12/1987 | Clemens | 165/80.3 X |
| 5,208,731 | 5/1993 | Blomquist | 361/704 |
| 5,241,453 | 8/1993 | Bright et al. | 361/704 |
| 5,282,111 | 1/1994 | Hopfer | 361/704 |
| 5,331,507 | 7/1994 | Kyung et al. | 24/458 X |
| 5,600,540 | 2/1997 | Blomquist | 24/458 X |
| 5,638,258 | 6/1997 | Lin | 361/704 |
| 5,671,118 | 9/1997 | Blomquist | 24/458 X |
| 5,755,276 | 5/1998 | Chiou | 361/704 X |
| 5,771,960 | 6/1998 | Lin | 361/704 X |
| 5,828,553 | 10/1998 | Chiou | 24/458 X |
| 5,860,195 | 1/1999 | Wang | 24/459 |
| 5,870,287 | 2/1999 | Rodriguez | 361/704 |

*Primary Examiner*—James R. Brittain
*Assistant Examiner*—Robert J. Sandy
*Attorney, Agent, or Firm*—Pillsbury Madison & Sutro LLP

[57] ABSTRACT

An engaging member is provided for securing a heat dissipating device to an electronic device. The engaging member includes a retaining section, two inclined sections respectively extending outwardly and upwardly from ends of the retaining section along a longitudinal direction of the retaining section, two vertical sections each having an engaging section to releasably secure the heat dissipating device and the integrated circuit together, and an intermediate section interconnected between each inclined sections and an associated vertical section. At least one of the inclined sections includes a first slot, and the associated vertical section includes a second slot in alignment with the first slot. The first slot and the second slot are to be extended by a disengagement member to disengage the engaging member from the electronic device, thereby allowing disengagement of the heat dissipating device from the electronic device.

10 Claims, 11 Drawing Sheets

ENGAGEMENT DEVICES WITH DISENGAGING MEANS FOR HEAT DISSIPATING DEVICES

CROSS REFERENCE TO RELATED APPLICATION

This is a continuation-in-part (CIP) application of U.S. patent application ser. No. 08/946,059 filed on Oct. 7, 1997 by the same applicant of this invention, which is now abandoned.

BACKGROUND OF THE INVENTION

1. Field of the Invention

The present invention relates to engaging devices with disengaging means for disengaging a heat dissipating device from an integrated circuits.

2. Description of the Related Art

A wide variety of heat dissipating devices and the engaging devices therefor have heretofore been provided for, e. g., integrated circuits of computers, yet a common drawback thereof resides in difficulty and inconvenience in disengagement of the engaging devices from the heat dissipating devices. The present invention is intended to provide engaging devices with disengaging means to solve this problem.

SUMMARY OF THE INVENTION

It is an object of the present invention to provide engaging devices with disengaging means for conveniently disengaging the heat dissipating device from the integrated circuit.

In accordance with one aspect of the invention, an engaging member is provided for securing a heat dissipating device to an integrated circuit. The engaging member is resilient and comprises:
 a retaining section having two ends,
 two inclined sections respectively extending outwardly and upwardly from the ends of the retaining section along a longitudinal direction of the retaining section,
 two vertical sections each having an engaging section to releasably secure the heat dissipating device and the integrated circuit together, and
 an intermediate section interconnected between each inclined section and an associated vertical section.

At lease one of the inclined sections includes a first slot, and the associated vertical section includes a second slot in alignment with the first slot. The first slot and the second slot are to be extended by a member to disengage the engaging member from the integrated circuit, thereby allowing disengagement of the heat dissipating device from the integrated circuit.

In an embodiment of the invention, the engaging section includes at least one engaging hole or a hook.

Preferably, at least one of the first slot and the second slot includes a retainer element formed adjacent thereto. The retainer element, the first slot, and the second slot may be formed by punching.

In an preferred embodiment of the invention, the first slot and the second slot respectively have a first retainer element and a second retainer element formed adjacent thereto, wherein the first retainer element is formed on a first edge forming a portion of a periphery defining the first slot, and the second retainer element is formed on a second edge forming a portion of a periphery defining the second slot and opposite to the first retainer element.

In the modified embodiment of the invention, more than two of the engaging members are interconnected.

In accordance with another aspect of the invention, there is provided a disengaging means for disengaging a heat dissipating device from an integrated circuit which are secured together by the above-mentioned engaging member. The disengaging means comprises a main body extended through the first slot and the second slot of the engaging member and a grasp section for manual operation to disengage the engaging member from the integrated circuit, thereby allowing disengagement of the heat dissipating device from the integrated circuit. The main body may include a shoulder which bears against a periphery on an outer surface of the vertical section defining the second slot. The main body may include at least one neck formed thereon. In addition, the main body may include at least one retainer element formed thereon. Further, the grasp section is formed at a level higher than the main body.

In a preferred embodiment of the invention, the main body includes two retainer elements formed thereon for respectively engaging with the inclined section and the vertical section of the engaging member to thereby prevent from disengagement of the disengaging means from the engaging member. Preferably, the retainer elements are formed on opposite sides of the main body.

In accordance with a further aspect of the invention, an engaging means is provided and comprises:
 a retaining section having two ends,
 two inclined sections respectively extending outwardly and upwardly from the ends of the retaining section along a longitudinal direction of the retaining section,
 two vertical sections each having an engaging section to releasably secure the heat dissipating device and the integrated circuit together, and
 an intermediate section interconnected between each inclined section and an associated vertical section,
 at lease one of the inclined sections including a first slot, and the associated vertical section including a second slot in alignment with the first slot, and
 a disengaging means for disengaging the heat dissipating device from the integrated circuit, the disengaging mean comprising:
  a main body extended through the first slot and the second slot of the engaging member, and
  a grasp section for manual operation to disengage the engaging member from the integrated circuit, thereby allowing disengagement of the heat dissipating device from the integrated circuit.

Other objects, advantages and novel features of the invention will become more apparent from the following detailed description when taken in conjunction with the accompanying drawings.

BRIEF DESCRIPTION OF THE DRAWINGS

The present invention will now be described in detail with reference to the accompanying drawings wherein.

DETAILED DESCRIPTION OF THE INVENTION

Figure 1:
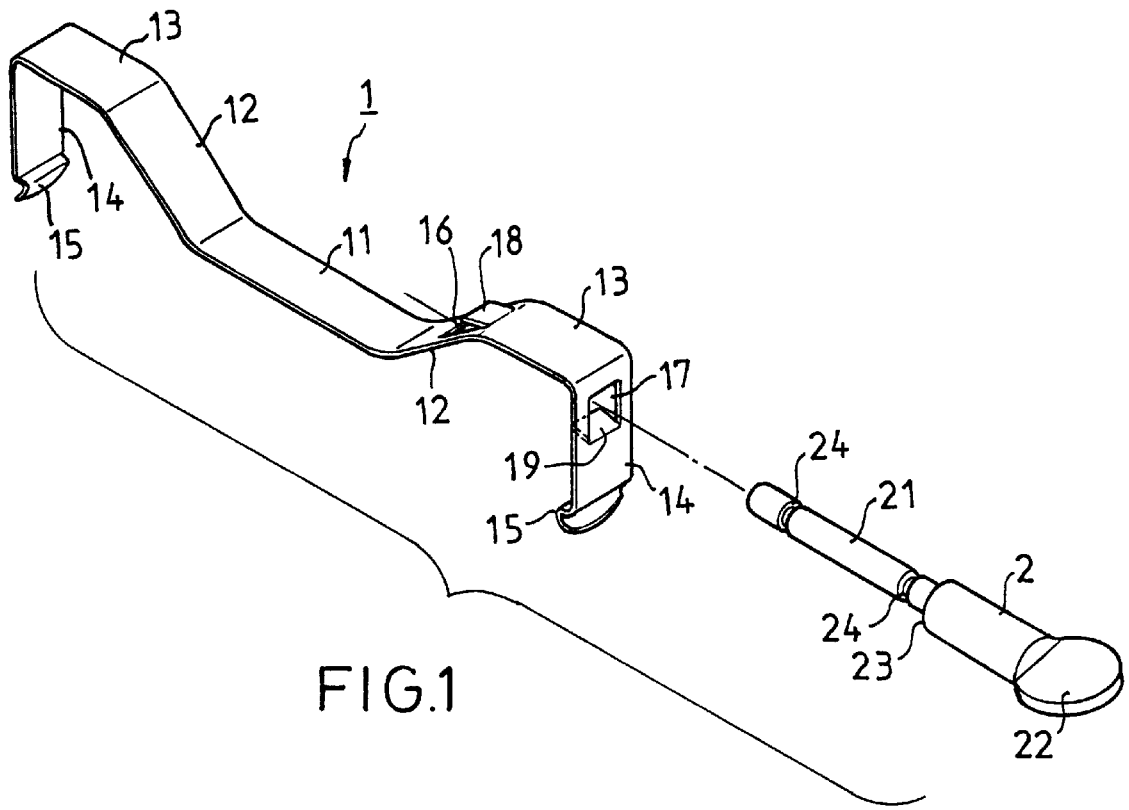
FIG. 1 is an exploded perspective view of a first embodiment of the engaging device in accordance with the present invention.
Figure 2:
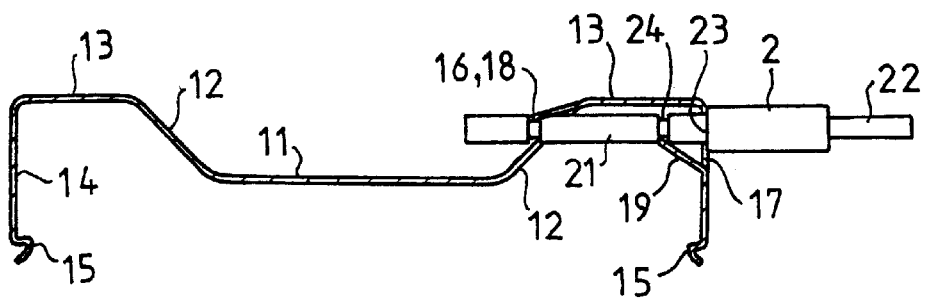
FIG. 2 is a sectional side view of the engaging device in FIG. 1.

Referring to the drawings and initially to FIGS. 1 and 2, and engaging device in accordance with the present invention generally includes a substantially M-shaped engaging member 1 for engaging a heat dissipating device 9 with an integrated circuit, e.g., a central processing unit (CPU) 93 (see FIGS. 3 and 4), and a disengaging means 2. The engaging member 1, preferably an integral metallic piece formed by means of punching, includes a retaining section 11, an inclined section 12 extending outwardly and upwardly from each of two ends of the retaining section 11 along a longitudinal direction of the retaining section 11, an intermediate section 13 which may be of any desired shape and which has a first end extending from a distal end of each inclined section 12 and a second end which is connected to a vertical section 14 having an engaging section 15 for releasably securing the heat dissipating device 9 and the CPU 93 together. The engaging section 15 may include and engaging hole or a hook to achieve the required securing function.

At least one of the inclined sections 12 includes a first slot 16, and the associated vertical section 14 (i.e., the section 14 which is located on the same side of the retaining section 11 as the section 12) includes a second slot 17 in alignment with the first slot 16. In addition, the inclined section 12 may include a first retainer element 18 formed in the vicinity of the first slot 16, and the section 14 may include a second retainer element 19 formed in the vicinity of the second slot 18, which will be described later. Punching may be used to form the slots 16 and 17 as well as the retainer elements 18 and 19. Further, the retainer elements 18 and 19 may be arranged in a symmetric manner, e.g., if the first retainer element 18 is formed along an upper edge which forms a portion of a periphery defining the first slot 16, the second retainer element 19 is formed along a lower edge which forms a portion of a periphery defining the second slot 17, as shown in FIG. 1, or if the first retainer element 18 is formed along a left edge which forms a portion of the periphery defining the first slot 16, the second retainer element 19 is formed along a right edge which forms a portion of the periphery defining the second slot 17. This may provide a better positioning effect for the disengaging means 2, as shown in FIG. 2.

The disengaging means 2 is, e.g., a rod having a main body 21 and a grasp section 22 (e.g., an enlarged flat section shown in FIG. 1). The main body 21 may be rod-like or plate-like and sized to be extendible through the first and second slots 16 and 17. The main body 21 includes a shoulder 23 which bears against the periphery defining the second slot 17, best shown in FIG. 2. In addition, the main body 21 may include two spaced necks 24 for respectively engaging with the first and second retainer elements 18 and 19 to thereby prevent from disengagement of the disengaging means 2 from the engaging member 1.

Figure 3:
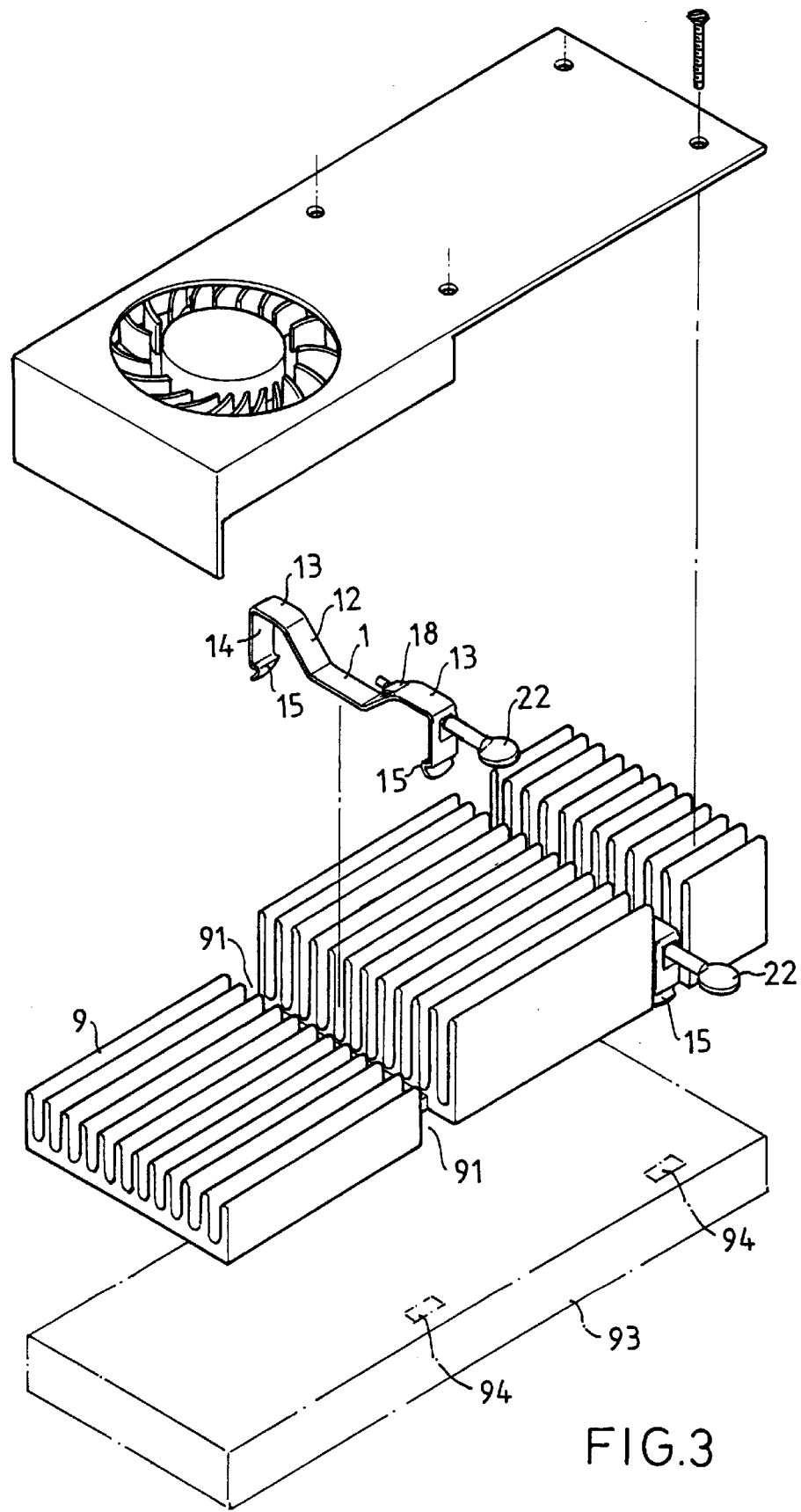
FIG. 3 is an exploded view illustrating application of the engaging device in FIG. 1 on a heat dissipating device.
Figure 4:
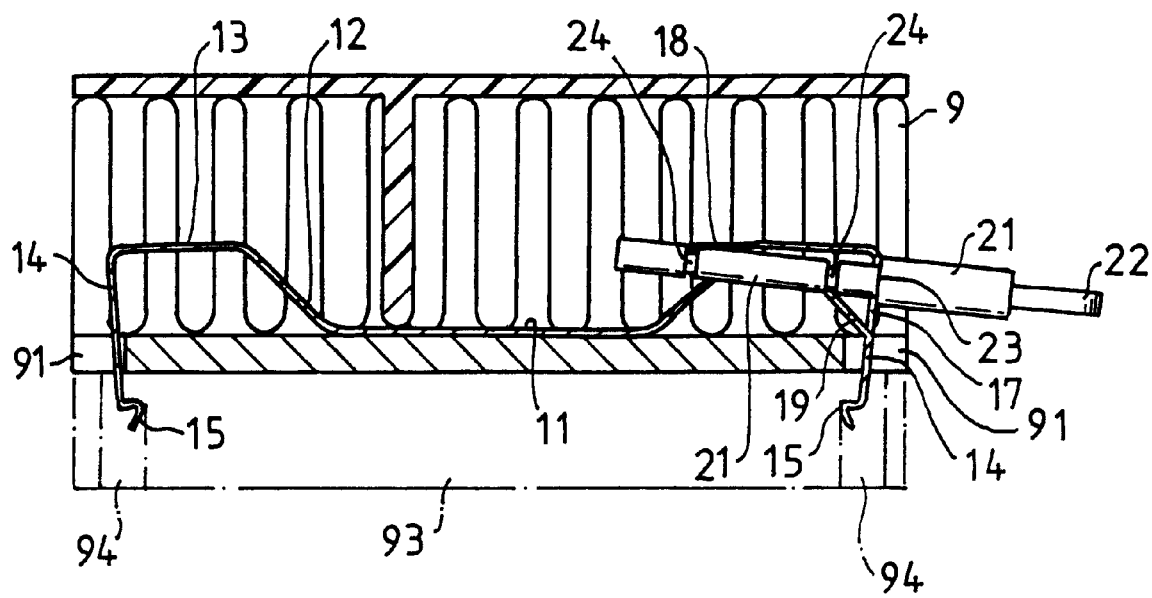
FIG. 4 is a schematic cross sectional view of the engaging device and the heat dissipating device.
Figure 5:
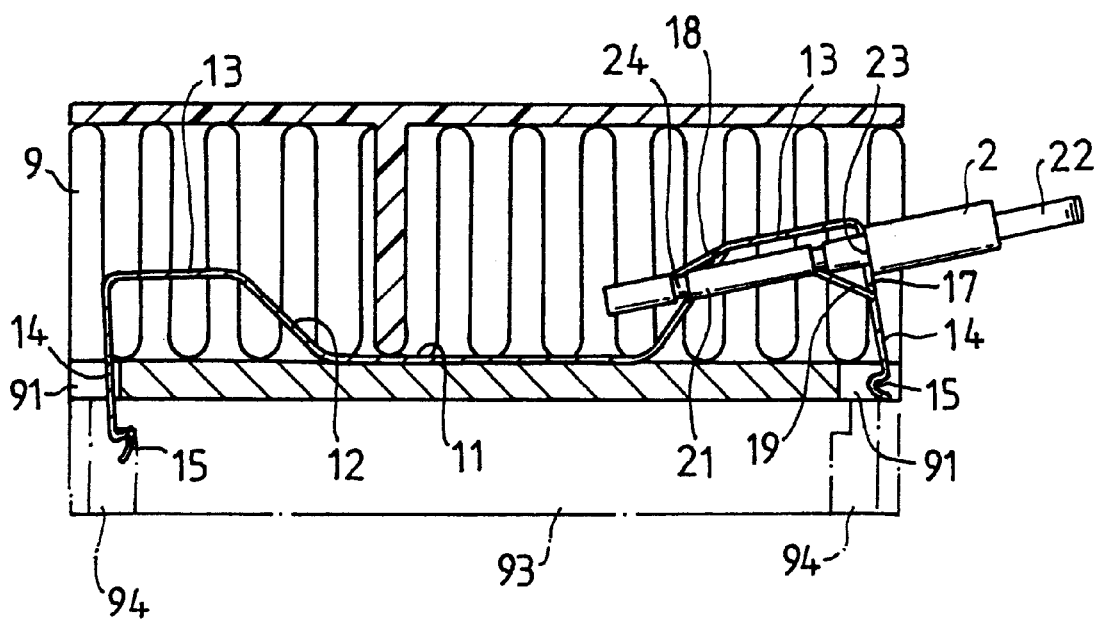
FIG. 5 is a view similar to FIG. 4, illustrating disengagement of the engaging device from the heat dissipating device.

In use, as shown in FIGS. 3 and 4, the engaging member 1 is received in an engaging groove 91 defined in the heat dissipating device 9, while the engaging sections 15 are respectively extended through engaging sections 94 (e.g., two slots 94, see FIG. 3) of the CPU 93 to keep the heat dissipating device 9 in a close contact with the CPU 93 for heat dissipating purpose. It is noted that the grasp section 22 is beyond the heat dissipating device 9.

When disengagement of the heat dissipating device 9 from the CPU 93 is required, the user may simply, easily grasp at the grasp section 22 and apply an upward and inward force to cause disengagement of one engaging section 15 (the right one) from the CPU 93. Thus, the engaging member 1 and the heat dissipating device 9 are readily removable from the integrated circuit 93.

Figure 6:
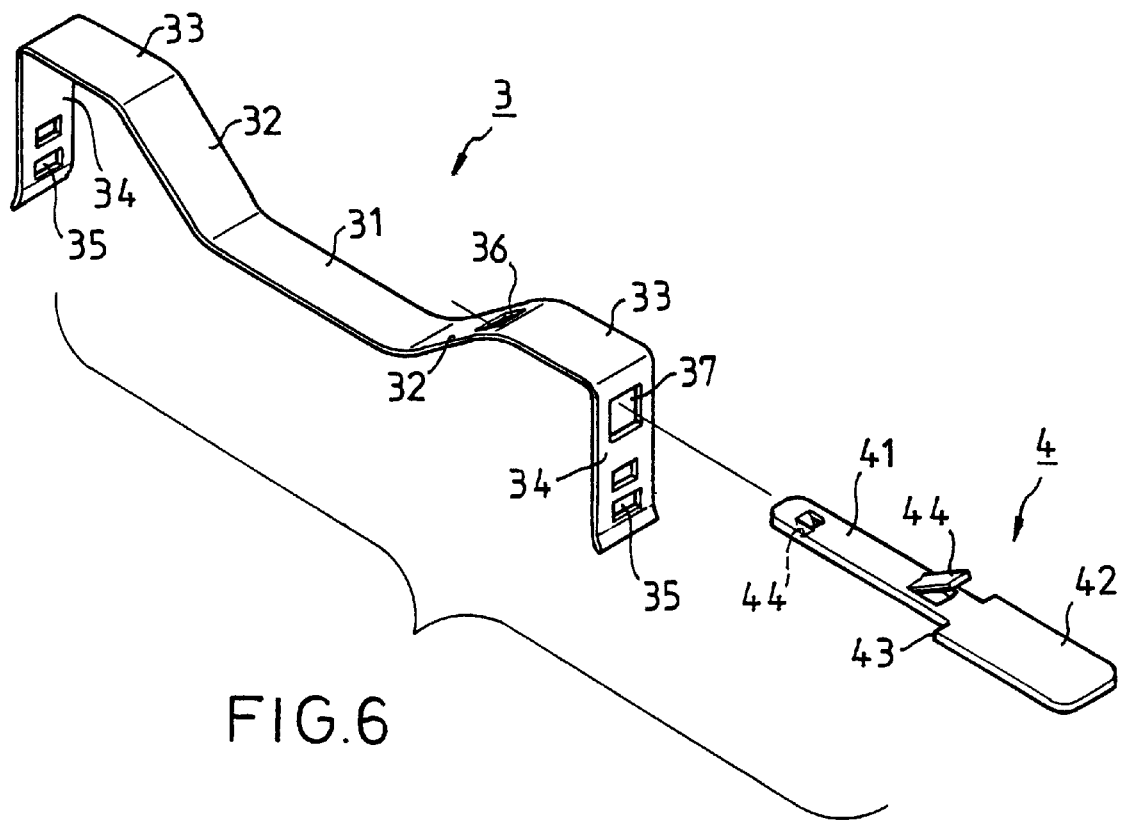
FIG. 6, is an exploded perspective view of a second embodiment of the engaging device in accordance with the present invention.
Figure 7:
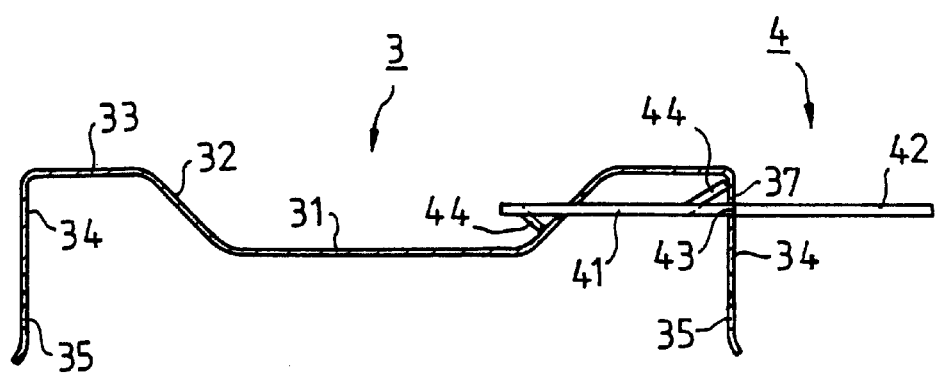
FIG. 7 is a sectional side view of the engaging device in FIG. 6.

FIGS. 6 and 7 illustrate a second embodiment of the engaging device in accordance with the present invention, wherein like reference numerals designate like elements except that the engaging member is now designated by "3" and the disengaging means is now designated by "4", while the reference numerals for the associated sections of the engaging member and the disengaging means are respectively led by reference characters "3" and "4", which is self-explanatory when comparing FIGS. 6 and 7 with FIGS. 1 and 2. In this embodiment, the engaging section, now designated by "35" includes at least one engaging holes instead of the hook 15 in the first embodiment. In addition, the retainer elements 18 and 19 of the engaging member 1 as well as the necks 24 and the shoulder 23 of the disengaging means 2 in the first embodiment are omitted. In stead, the disengaging means, now designated by "4" includes at least one retainer element 44 (two retainer elements in this embodiment) for engaging with the inclined section 32 and/or the vertical section 34, best shown in FIG. 7. Further, the grasp section 42 of the disengaging means 4 is plate-like for easy grasp.

Figure 8:
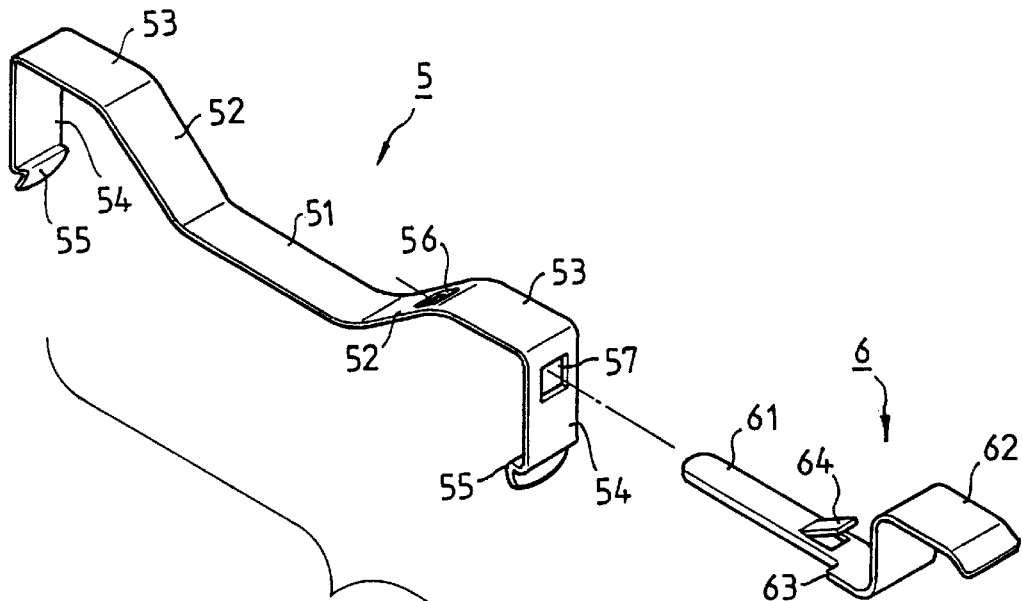
FIG. 8 is an exploded perspective view of a third embodiment of the engaging device in accordance with the present invention.

FIG. 8 illustrates a third embodiment modified from the second embodiment, wherein like reference numerals designate like elements except that the engaging member is now designated by "5" and the disengaging means is now designated by "6", while the reference numerals for the associated sections of the engaging member and the disengaging means are respectively led by reference characters "5"and "6", which is self-explanatory when comparing FIG. 8 with FIG. 6. In this embodiment, the disengaging means 6 includes a retainer elements 64 for engaging with the vertical section 54. In addition, the grasp section 62 of the disengaging means 6 extends at a level higher than the main body 61 for easy grasp.

Figure 9:
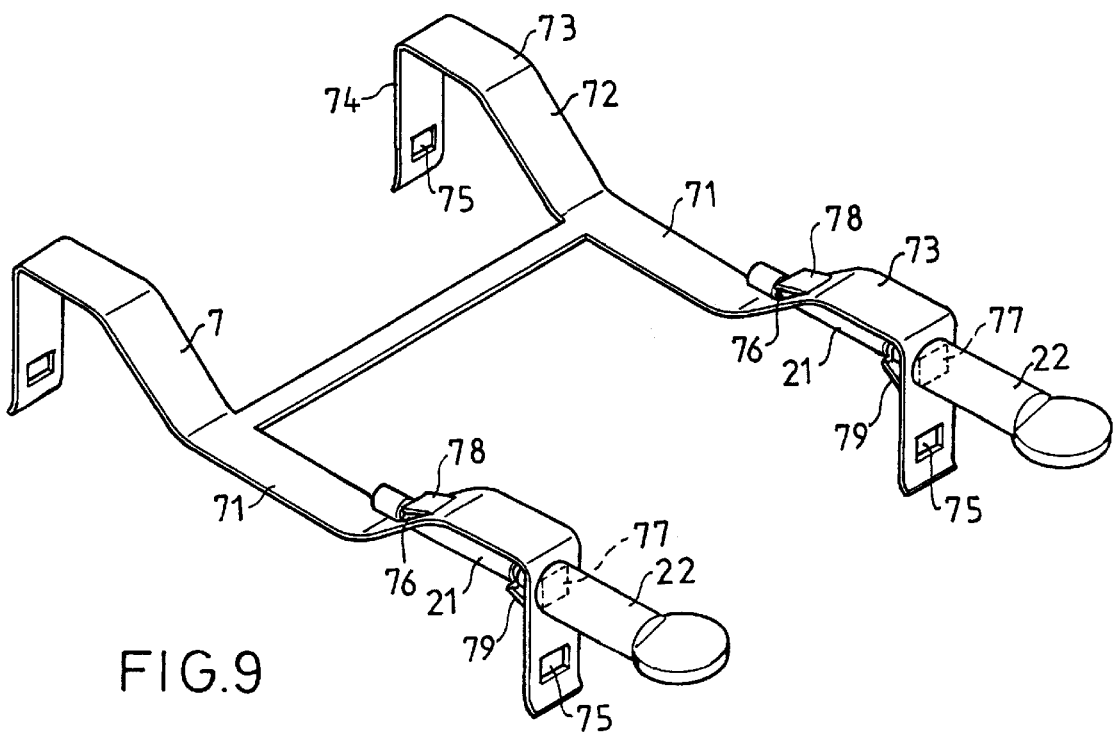
FIG. 9 is an coded perspective view of a fourth embodiment of the engaging device in accordance with the present invention.
Figure 10:
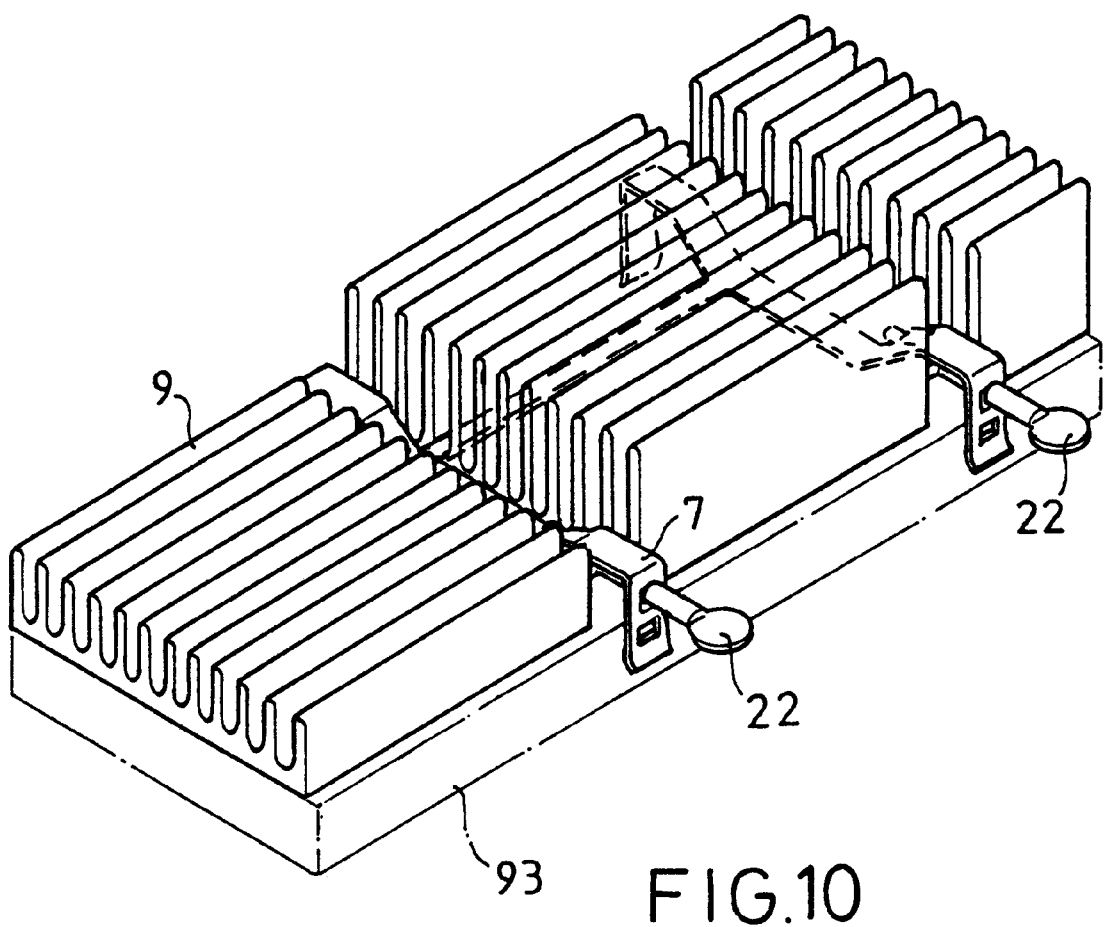
FIG. 10 is an exploded view illustrating application of the engaging device in FIG. 9 on a heat dissipating device

FIG. 9 illustrates a fourth embodiment of the engaging device in accordance with the present invention, wherein two engaging members (now designated by "7") are interconnected by a beam (not labeled) and are integrally formed. It is appreciated that like reference numerals designate like elements except that each engaging member is now designated by "7", while the reference numerals for the associated sections of the engaging members are led by reference characters "7", which is self-explanatory when comparing FIG. 9 with FIG. 1. In this embodiment, the engaging section 75 includes an engaging hole instead of the hook 15 in FIG. 1. Application of the dual engaging members/dual disengaging means is shown in FIG. 10, which is similar to that disclosed in the first embodiment and is therefore not redundantly described. Disengagement of the heat dissipating device 9 from the CPU 93 is achieved by simultaneously pulling the two disengaging means 22 upwardly and inwardly.

Figure 11:
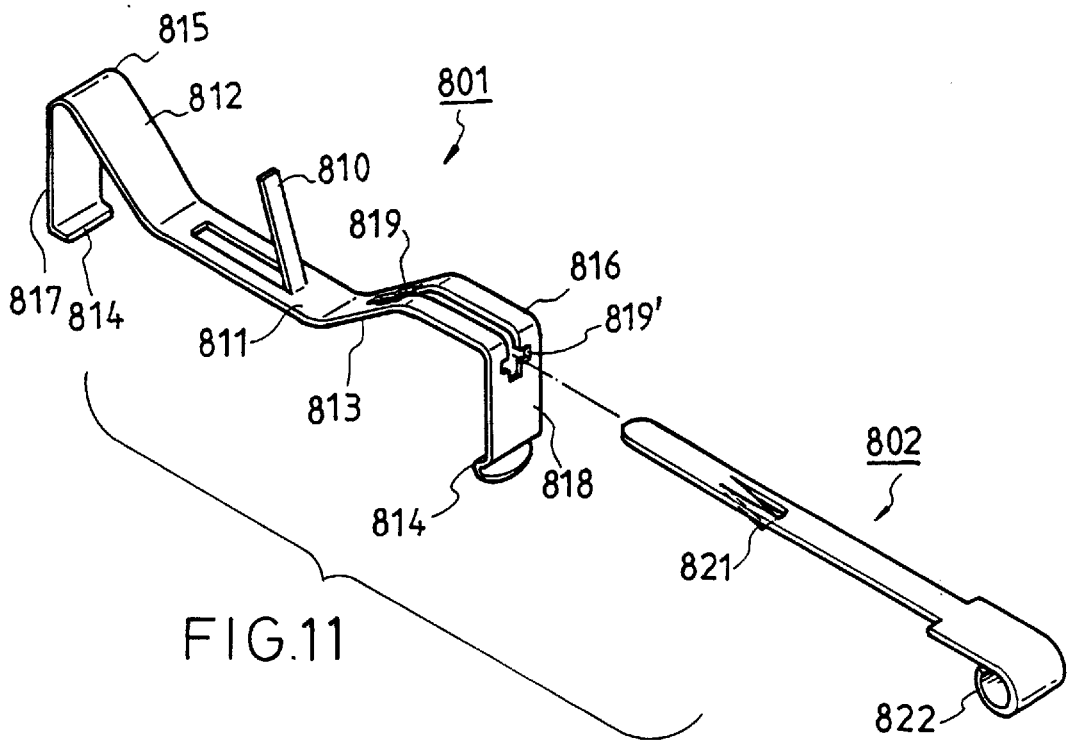
FIG. 11 is an exploded perspective view of a fifth embodiment of the engaging device in accordance with the present invention.
Figure 12:
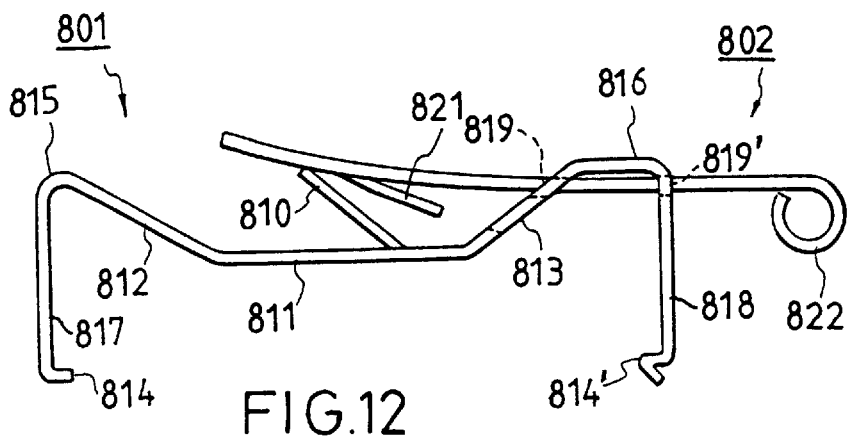
FIG. 12 is a sectional side view of the engaging device in FIG. 11.
Figure 13:
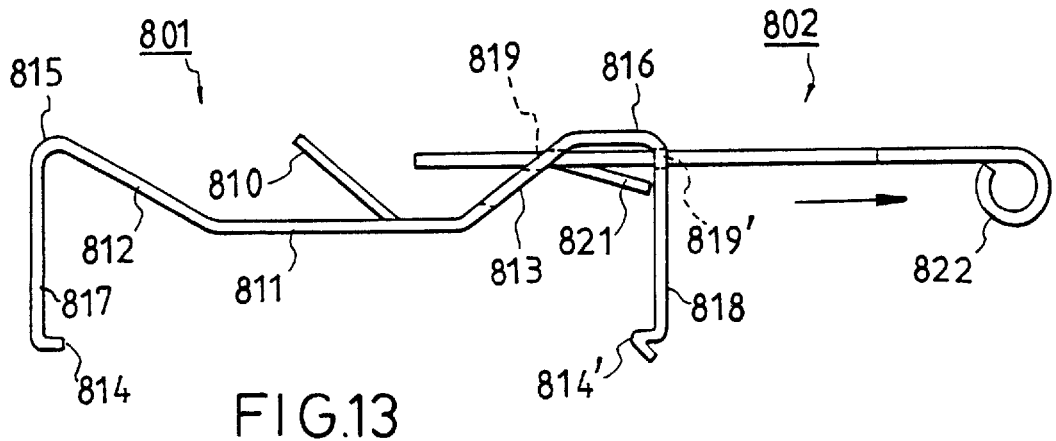
FIG. 13 is a motive view of the engaging device in FIG. 12.

FIGS. 11, 12 and 13 illustrate a fifth embodiment of the engaging device in accordance with the present invention, a M-shaped engaging member 801 includes a retaining section 811, two inclined sections 812, 813 extending outwardly and upwardly from each of two ends of the retaining section 811 along a longitudinal direction of the retaining section 811, two intermediate sections 815, 816 having a first end extending from a distal end of two inclined sections 812, 813 and a second end connected to two vertical sections 817, 818, the end of the vertical sections 817, 818 having two engaging sections 814, 814'. The inclined section 813 includes a first slot 819, and the vertical section 818 also includes a second slot 819' in alignment with the first slot 819. In addition, the retaining section 811 further includes an elastic element 810 extending upwardly from its upper surface.

A disengaging means 802 includes a main body having an elastic element 821 and a grasp section 822, the elastic element 821 extends downwardly and the grasp section 822 locates at one end of the disengaging means 802. The disengaging means 802 extends through the first slot 819 and the second slot 819' while assembling. Then, the elastic element 810 of the retaining section 811 lifts the other end of the disengaging means 802, thereby the disengaging means 802 pressing the lower edge of the first slot 819 and the second slot 819'. Accordingly, the retaining section 811 is pressed tightly on the engaging groove of the heat dissipating fin.

Figure 14:
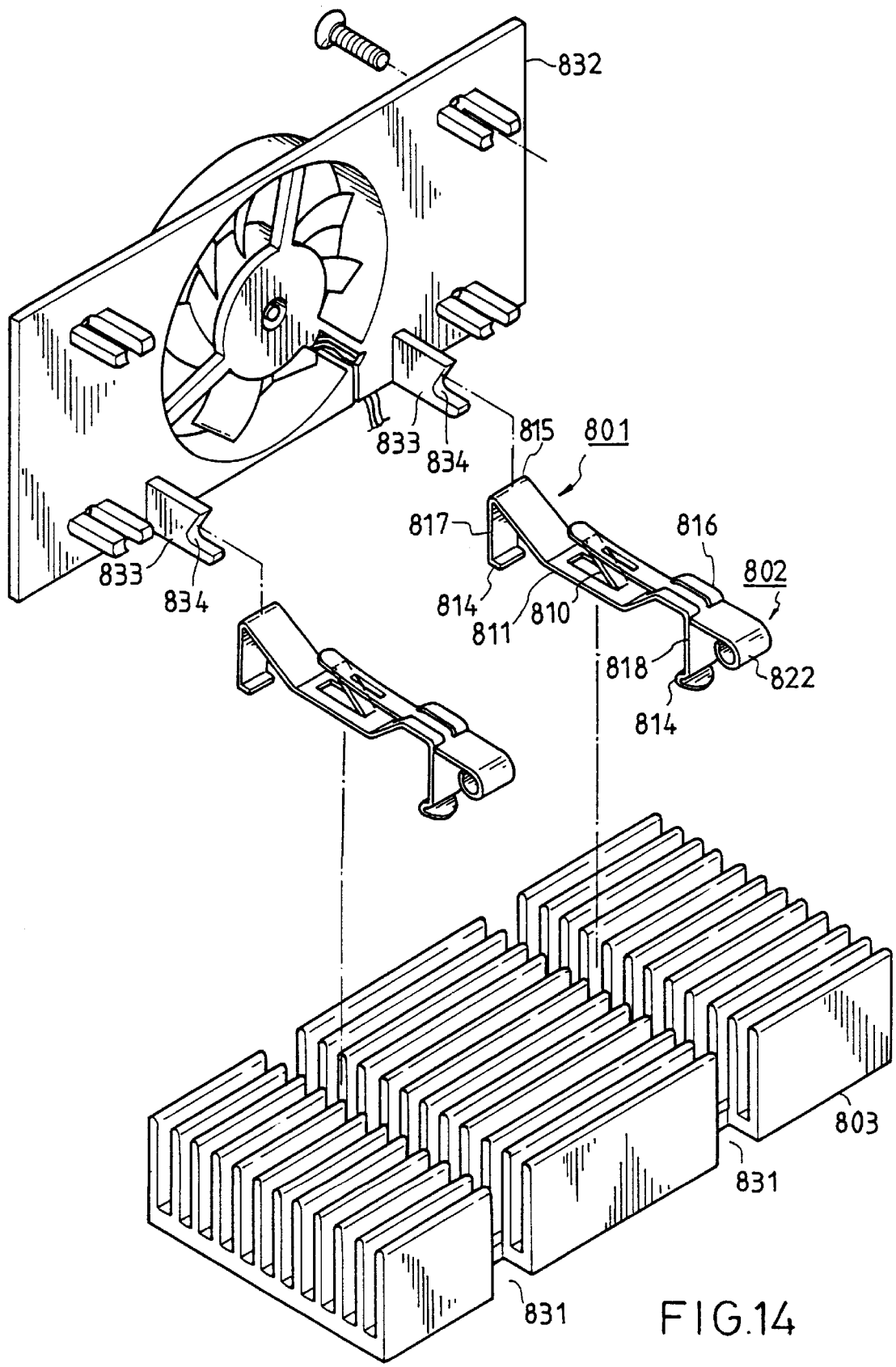
FIG. 14 is an exploded view illustrating application of the engaging device in FIG. 11 on a heat dissipating device.
Figure 15:
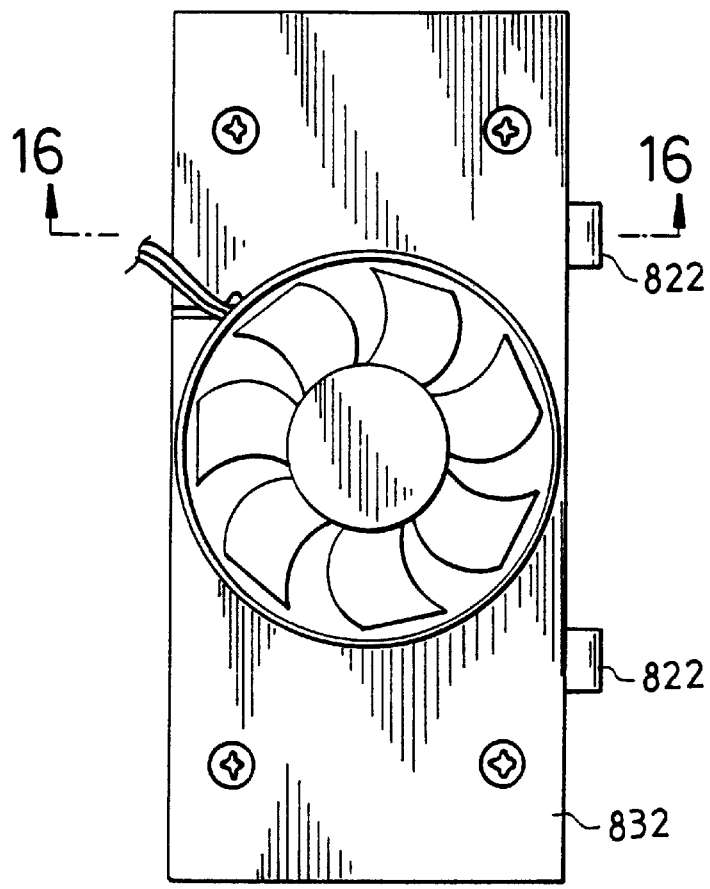
FIG. 15 is a top view of the engaging device in FIG. 14.
Figure 16:
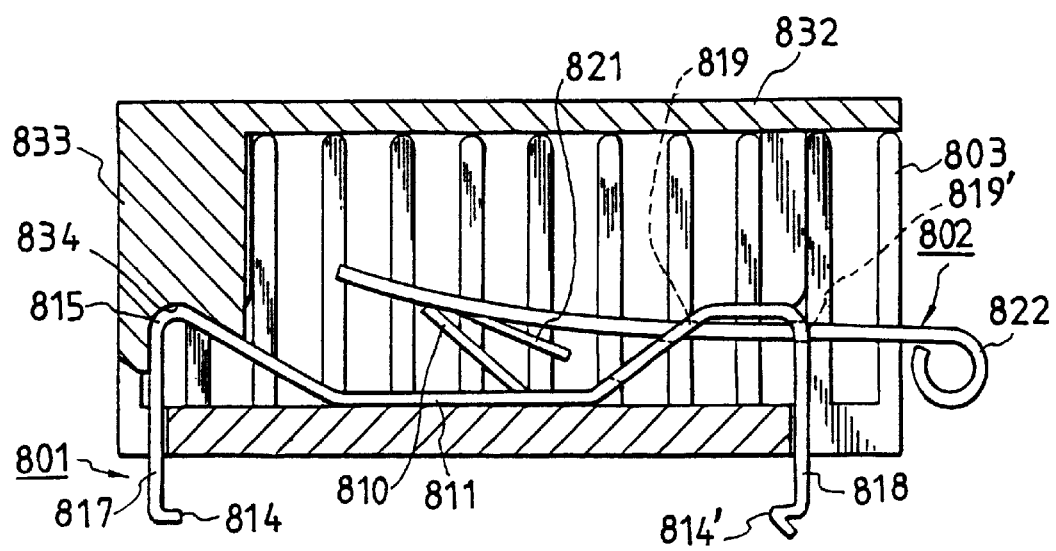
FIG. 16 is a sectional view taken along line 16—16 of FIG. 15.

Referring to FIGS. 14, 15 and 16, the engaging member 801 is received in an engaging groove 831 defined between the heat dissipating fin 803. A cover 832 includes a plurality of legs 833 and 834, wherein, when the cover 832 is mounted onto the heat dissipating fin 803, the cut of the legs 834 presses against the intermediate sections 815 of the engaging member 801 so as to hold the engaging member 801 tightly in the engaging groove 831.

Figure 17:
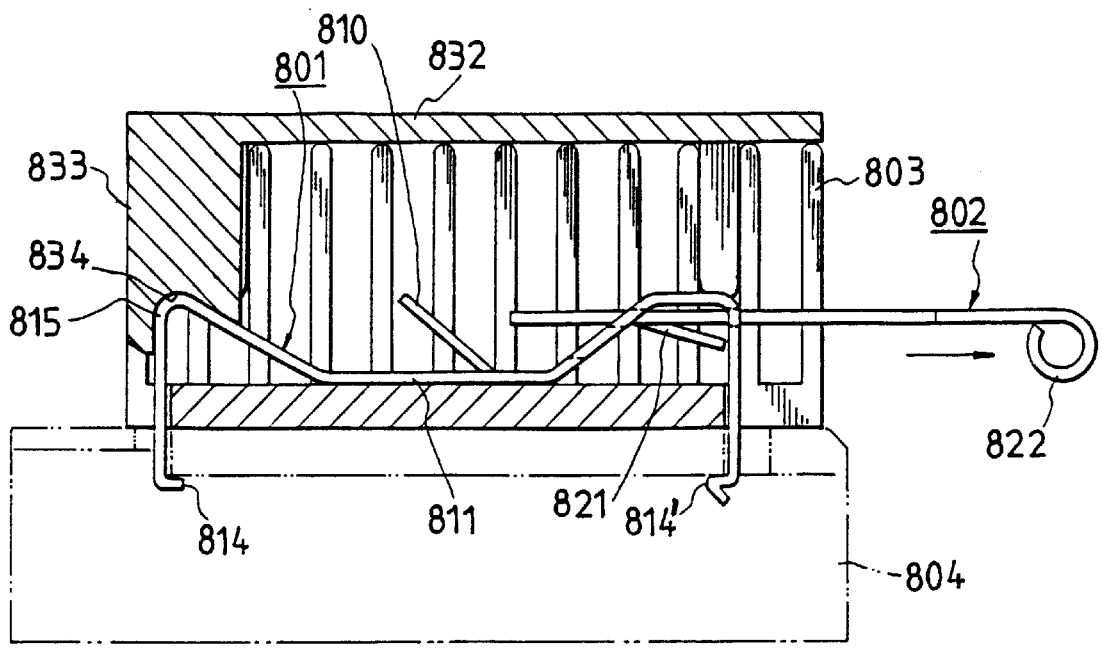
FIG. 17 is a motive view of the engaging device in FIG. 16.
Figure 18:
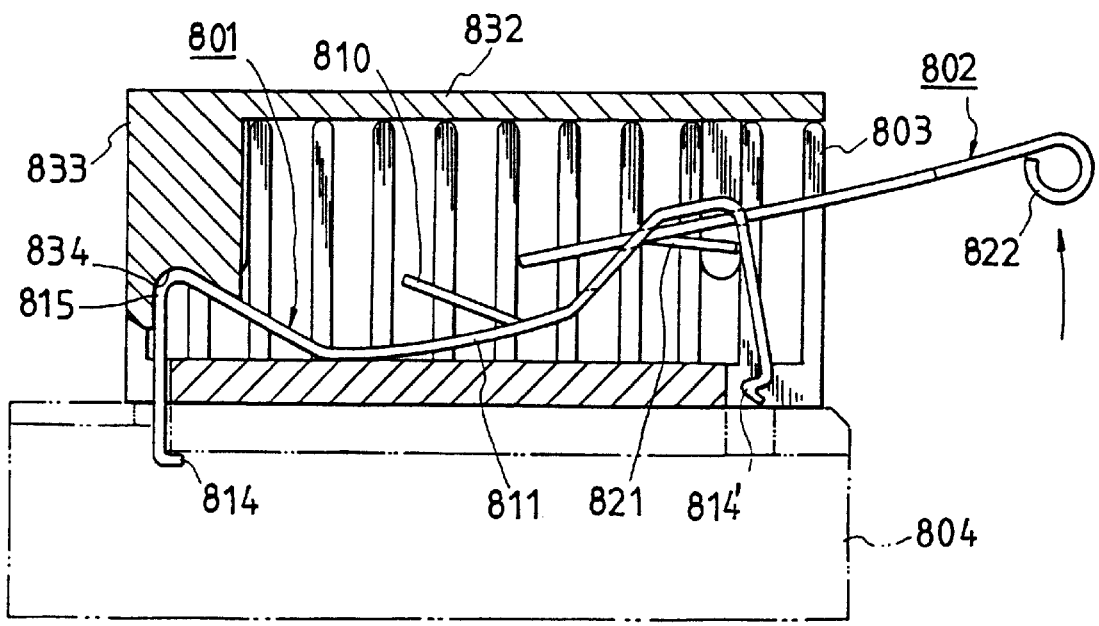
FIG. 18 is a motive view of the engaging device in FIG. 16.

Referring to FIGS. 16, 17 and 18, when assembled, the engaging sections 814, 814' of the engaging member 801 extend through the hole (not labeled) of the central processing unit 804 and engage with the edge of the hole. For the disengagement, the disengaging means 802 is pulled outwardly along longitudinal direction of the retaining section 811 and lifted upwardly with the result that the engaging section 814' is released from the edge of the hole of the central processing unit 804, as shown in FIG. 18.

Figure 19:
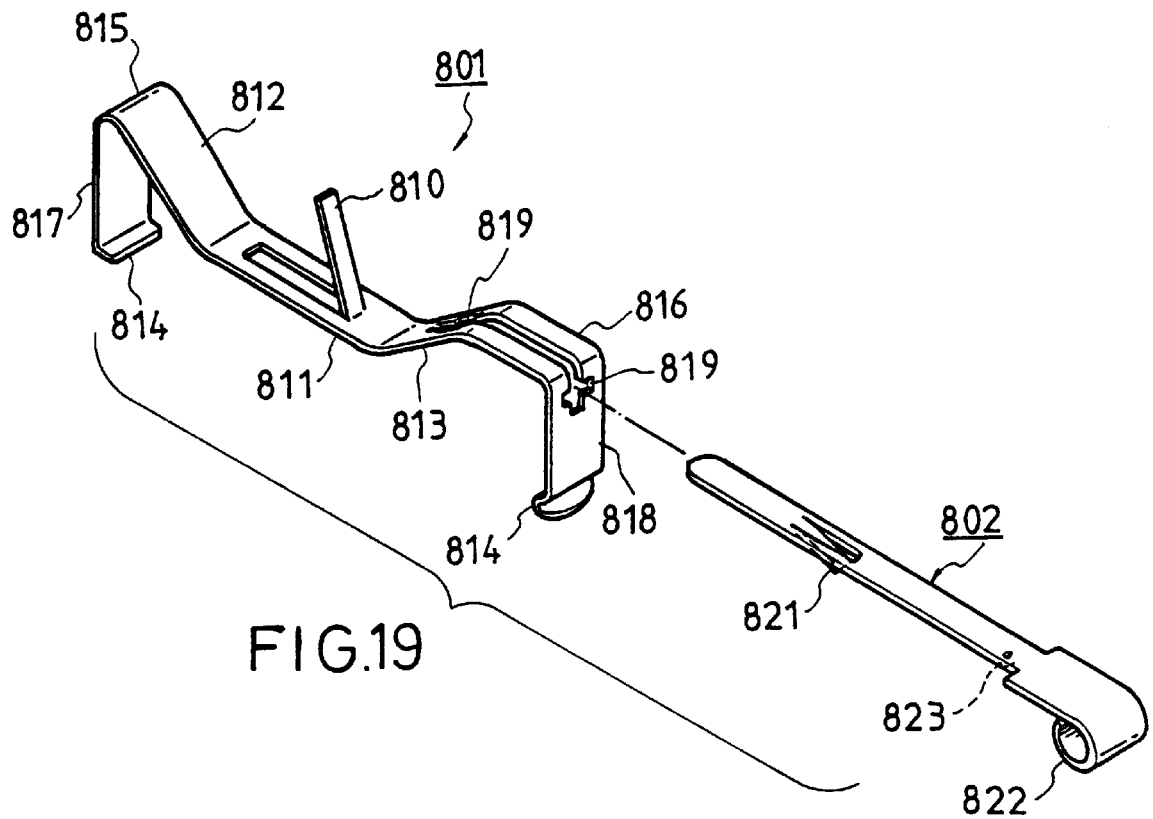
FIG. 19 is an exploded perspective view of a sixth embodiment of the engaging device in accordance with the present invention.
Figure 20:
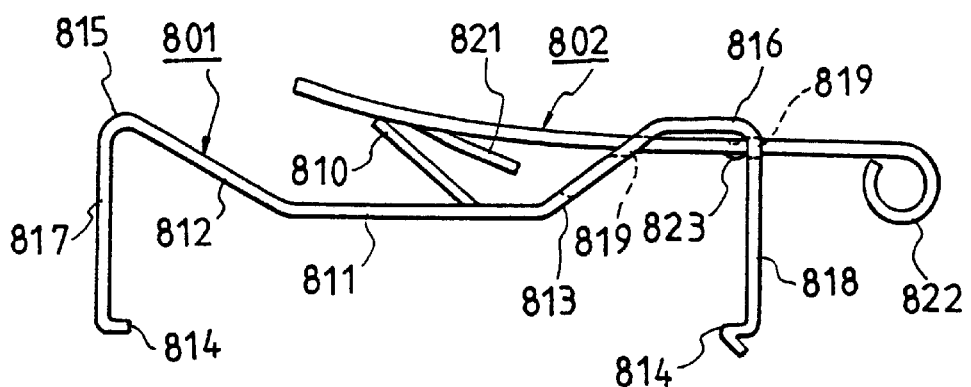
FIG. 20 a sectional side view of the engaging device in FIG. 19.

FIGS. 19 and 20 illustrate a sixth embodiment of the engaging device in accordance with the present invention, the disengaging means 802 further includes a protrusion 823 defined on its underside surface thereon. When assembled, the engaging sections 814, 814' of the engaging member 801 extend through the hole of the central processing unit and engage with the edge of the hole and the protrusion 823 is blocked in the second slot 819' such that the protrusion 823 prevent the disengagement of the disengaging means 802 from the engaging member 801.

Although the invention has been described in detail with reference to its presently preferred embodiment, it will be understood by one of ordinary skill in the art that various modifications can be made without departing from the spirit and the scope of the invention, as set forth in the appended claims.

What is claimed is:

1. An engaging member for securing a heat dissipating device to an electronic device, the engaging member being resilient and comprising:
  a retaining section having two ends,
  two inclined sections respectively extending outwardly and upwardly from the ends of said retaining section along a longitudinal direction of said retaining section,
  two vertical sections, each of said vertical sections having an engaging section adapted to releasably secure the heat dissipating device and the electronic device together;
  two intermediate sections for connecting each of said inclined section and said associated vertical section, and
  a disengaging member includes a main body having at least a neck section defined thereon, said main body further includes a grasp section for manual operation to disengage the engage member from the electronic device,
  wherein at least one of said inclined sections including a first slot, and the associated vertical section including a second slot in alignment with said first slot, said first slot and said second slot being adapted to be extended by said disengaging member to disengage said disengaging member from the electronic device, and wherein a retainer element formed in the vicinity of said first slot thereon so as to engage with said neck section of said disengaging member.

2. The engaging member according to claim 1, wherein said second slot of said vertical section includes a retainer element formed in the vicinity of said second slot so as to engage with said neck section of said disengaging member.

3. The engaging member according to claim 1, wherein said main body includes two spaced neck sections, and said first slot of said inclined section includes a first retainer element formed in the vicinity of said first slot and said second slot of said vertical section includes a second retainer element formed in the vicinity of said second slot, said first and second retainer elements engage respectively with said spaced neck sections of said disengaging member.

4. The engaging member according to claim 1, wherein one of said engaging sections of said vertical sections includes at least one engaging hole.

5. The engaging member according to claim 1, wherein one of said engaging sections of said vertical sections includes a hook.

6. An engaging member for securing a heat dissipating device to an integrated circuit, the engaging member being resilient and comprising:

a retaining section having two ends includes an elastic element defined on its surface thereon, two inclined sections respectively extending outwardly and upwardly from the ends of said retaining section along a longitudinal direction of said retaining section, two vertical sections, each of said vertical sections having an engaging section adapted to releasably secure the heat dissipating device and the integrated circuit together, two intermediate sections, each of said intermediate sections interconnected between each of said inclined section and an associated said vertical section, and a disengaging member includes a main body having a grasp section for manual operation to disengage the engage member from the integrated circuit, wherein at least one of said inclined sections including a first slot, and the associated vertical section including a second slot in alignment with said first slot, said first slot and said second slot being adapted to be extended by said disengaging member, and wherein said elastic element of said retaining section lifts the other end of said disengaging member so as to lead said disengaging member pressing the lower edge of said first slot and said second slot, with the result that said retaining section is able to be pressed tightly on an engaging groove of a heat dissipating fin on the heat dissipating device.

7. The engaging member according to claim 6, wherein said elastic element of said retaining section extends upwardly thereon.

8. The engaging member according to claim 6, wherein said main body of said disengaging member further includes an elastic member defined on its surface thereon.

9. The engaging member according to claim 8, wherein said elastic element extends downwardly thereon.

10. The engaging member according to claim 6, wherein said main body of said disengaging member further includes a protrusion defined on its surface thereon.

* * * * *